US010340917B2

(12) United States Patent
Dey et al.

(10) Patent No.: US 10,340,917 B2
(45) Date of Patent: *Jul. 2, 2019

(54) RECEIVER CIRCUITRY AND METHOD FOR CONVERTING AN INPUT SIGNAL FROM A SOURCE VOLTAGE DOMAIN INTO AN OUTPUT SIGNAL FOR A DESTINATION VOLTAGE DOMAIN

(71) Applicant: ARM Limited, Cambridge (GB)

(72) Inventors: Ranabir Dey, Bangalore (IN); Vijaya Kumar Vinukonda, Bangalore (IN); Mikael Rien, Grenoble (FR)

(73) Assignee: ARM Limited, Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/823,481

(22) Filed: Nov. 27, 2017

(65) Prior Publication Data

US 2018/0083631 A1 Mar. 22, 2018

Related U.S. Application Data

(63) Continuation of application No. 14/814,029, filed on Jul. 30, 2015, now Pat. No. 9,831,876.

(30) Foreign Application Priority Data

Jul. 30, 2014 (GB) .................................. 1413490.2

(51) Int. Cl.
*H03K 19/185* (2006.01)
*H03K 19/0185* (2006.01)

(52) U.S. Cl.
CPC .......................... *H03K 19/018521* (2013.01)

(58) Field of Classification Search
USPC ....................................... 326/62–81; 327/333
See application file for complete search history.

(56) References Cited

U.S. PATENT DOCUMENTS 6,147,540 A * 11/2000 Coddington ....... H03K 19/0027
327/333
6,700,407 B1 3/2004 Wert
(Continued)

*Primary Examiner* — Seokjin Kim
(74) *Attorney, Agent, or Firm* — Pramudji Law Group PLLC; Ari Pramudji

(57) ABSTRACT

The present invention provides a receiver circuit and method for receiving an input signal from a source voltage domain and converting the input signal into an output signal for a destination voltage domain. The source voltage domain operates from a supply voltage that exceeds a stressing threshold of components within the receiver circuitry, and the receiver circuitry is configured to operate from the supply voltage of the source voltage domain. The receiver circuitry comprises first internal signal generation circuitry configured to convert the input signal into a first internal signal in a first voltage range, and second internal signal generation circuitry configured to convert the input signal into a second internal signal in a second voltage range. Signal evaluation circuitry establishes a logic high voltage threshold and a logic low voltage threshold dependent on the supply voltage, and employs the first and second internal signals in order to detect based on the logic high voltage threshold and logic low voltage threshold when the input signal transitions between a logic low level and a logic high level (in either direction). Output generation circuitry then generates the output signal in dependence on the detection performed by the signal evaluation circuitry. The first voltage range and the second voltage range are such that the first internal signal and second internal signal will not exceed the stressing threshold of components in the signal evaluation circuitry. The receiver circuitry is able to reliably detect transitions in the input signal in situations where the supply voltage of the source voltage domain exceeds the stressing threshold of the receiver's components, but without overstress of the receiver's components.

20 Claims, 8 Drawing Sheets

(56) References Cited

U.S. PATENT DOCUMENTS

2010/0264976 A1* 10/2010 Duby ................... H03K 5/08
    327/333
2014/0117953 A1* 5/2014 Hoefler ............. H03K 19/0013
    323/271

* cited by examiner

| DVDD | HYS | VIH | Spec VIH | VIL | Spec VIL | Hysteresis | Spec Hysteresis |
|---|---|---|---|---|---|---|---|
| 3.3V | ON | 1.65 | 2.0 | 0.833 | 0.8 | 171mV | 165mV |
| 2.5V | | 1.42 | 1.7 | 0.82 | 0.7 | 190mV | 165mV |
| 1.8V | | 0.60*DVDD | 0.65*DVDD | 0.39*DVDD | 0.35*DVDD | 169.2mV | 165mV |
| 3.3V | OFF | 1.34 | 2.0 | 0.91 | 0.8 | - | - |
| 2.5V | | 1.23 | 1.7 | 0.91 | 0.7 | - | - |
| 1.8V | | 0.55*DVDD | 0.65*DVDD | 0.45*DVDD | 0.35*DVDD | | - |

FIG. 8

RECEIVER CIRCUITRY AND METHOD FOR CONVERTING AN INPUT SIGNAL FROM A SOURCE VOLTAGE DOMAIN INTO AN OUTPUT SIGNAL FOR A DESTINATION VOLTAGE DOMAIN

CROSS-REFERENCE TO RELATED APPLICATIONS

This application is a continuation of U.S. Ser. No. 14/814029 filed on 2015 Jul. 30, which claims priority to United Kingdom Patent Application No. GB 1413490.2, filed 2014 Jul. 30, both of which are titled RECEIVER CIRCUITRY AND METHOD FOR CONVERTING AN INPUT SIGNAL FROM A SOURCE VOLTAGE DOMAIN INTO AN OUTPUT SIGNAL FOR A DESTINATION VOLTAGE DOMAIN and the entire disclosures of which are herein incorporated by reference.

FIELD OF THE INVENTION

The present invention relates to a receiver circuit and method for converting an input signal from a source voltage domain into an output signal for a destination voltage domain, in particular in situations where the source voltage domain uses a higher supply voltage than the destination voltage domain.

BACKGROUND OF THE INVENTION

In traditional designs of receiver circuitry, the receiver circuitry is configured to operate from a supply voltage that matches the "native voltage" (also referred to as a "technology limit value") of the components within the receiver circuitry. The voltage drop across any terminals of the components that make up the receiver circuitry should be lower than the native voltage in order to prevent damage due to overstress, which may in turn lead to reduced reliability. For example, if the receiver circuitry is constructed from CMOS devices with a native voltage of 1.8V, the receiver circuitry will typically utilise a 1.8V supply voltage. This supply voltage may well exceed the supply voltage of the destination voltage domain (for example in one example implementation the destination voltage domain may operate from a supply voltage of around 1V), and the receiver circuitry will generate an output signal that is down converted to the supply voltage range of the destination voltage domain.

The above approach works well provided that the voltage of the input signal does not vary in a range that exceeds the supply voltage of the receiver circuitry, i.e. in the above example the input signal does not vary in a range greater than 0 to 1.8V. However, in modern systems there is an increasing requirement for the receiver circuitry to be able to receive an input signal from a source voltage domain whose supply voltage may exceed the native voltage of the components used by the receiver circuitry. Considering the above specific case, it may for example be desirable for the receiver circuitry to also be able to handle input signals from a 2.5V or 3.3V source voltage domain. However, wherever the source voltage domain operates from a supply voltage that exceeds the native voltage of the components within the receiver circuitry, this can give rise to reliability problems due to components within the receiver circuitry potentially being exposed to a voltage overstress during the course of operation.

In addition, it is often desirable for the same design of receiver circuitry to be used in a range of different scenarios where the supply voltage of the source voltage domain may differ. For example, it would be useful for the same receiver circuitry to be able to operate with input signals that have a variety of different ranges of voltage swing, for instance 0 to 1.8V, 0 to 2.5V or 0 to 3.3V using the earlier examples. Indeed, in certain instances the source voltage domain may be able to switch between multiple different supply voltages (for example in different operating modes), and accordingly the receiver circuitry needs to be able to operate correctly irrespective of the current source supply voltage used by the source voltage domain.

However, in addition to the earlier mentioned overstress problem that can occur when the receiver circuitry is exposed to a source voltage domain whose supply voltage exceeds the native voltage of the components used by the receiver circuitry, another problem that can arise is in reliably detecting logic low to logic high and logic high to logic low transitions in the input signal across the various different voltage ranges of the input signal, in situations where the receiver circuitry operates from a supply voltage matching the native voltage of its components.

In particular, if the minimum input voltage that will cause detection of a logic high state of the input signal is referred to as VIH, and the maximum input voltage that will cause detection of a logic low state of the input signal is referred to as VIL, a situation can arise where there is insufficient margin to reliably detect the logic high and logic low states. For example, consider an instance where the input connection of the receiver circuitry is connected to a 3.3V driver in the system. In this instance, JEDEC TTL levels indicate that if the receiver circuitry uses a 1.8V supply voltage, then its corresponding VIH and VIL values would be 2V and 0.8V respectively. Hence such a receiver circuit would have to be sized to have its trip point for detecting a logic low level set higher than 0.8 V and its trip point for detecting a logic high level set lower than 2V. If the same receiver circuitry was then used to detect an input signal using a 1.8V supply voltage, then its VIH and VIL values would be 1.155V and 0.585V, respectively. The trip points would hence have to be set having regards to the lowest VIH and highest VIL, and in the above example it will be seen that there will hence only be a margin of 0.355V between the lowest VIH and highest VIL values. It is difficult to maintain reliable trip points with such a small margin across all process corners. Moreover, if effects such as noise are introduced, then this will further reduce the margin, potentially causing incorrect operation.

Accordingly, it would be desirable to provide an improved receiver circuitry design that alleviates the above-mentioned issues.

SUMMARY OF THE INVENTION

Viewed from a first aspect, the present invention provides receiver circuitry for receiving an input signal from a source voltage domain and converting the input signal into an output signal for a destination voltage domain, the source voltage domain operating from a supply voltage that exceeds a stressing threshold of components within the receiver circuitry, the receiver circuitry being configured to operate from the supply voltage of the source voltage domain and comprising: first internal signal generation circuitry configured to convert the input signal into a first internal signal in a first voltage range; second internal signal generation circuitry configured to convert the input signal into a second internal signal in a second voltage range; signal evaluation circuitry configured to establish a logic high voltage threshold and a logic low voltage threshold dependent on the supply voltage, and further configured to employ the first and second internal signals in order to detect based on the logic high voltage threshold and logic low voltage threshold when the input signal transitions between a logic low level and a logic high level (in either direction); and output generation circuitry configured to generate the output signal in dependence on the detection performed by the signal evaluation circuitry; wherein the first voltage range and the second voltage range are such that the first internal signal and second internal signal will not exceed the stressing threshold of components in the signal evaluation circuitry.

In accordance with the present invention, first and second internal signal generation circuits are used to convert the input signal into first and second internal signals have associated first and second voltage ranges. The first and second voltage ranges are configured such that neither of the two internal signals will exceed the stressing threshold of components in the signal evaluation circuitry (the stressing threshold may for example correspond to the native voltage of the components), and accordingly, irrespective of the value of the input signal, the first and second internal signals derived from that input signal can be provided directly to components in the signal evaluation circuitry without the risk of overstressing those components. If the input signal had instead directly been applied to the components in the signal evaluation circuitry such overstressing would have been likely to occur, and the above use of the first and second internal signals avoids that situation.

In addition, since the receiver circuitry is configured to operate from the supply voltage of the source voltage domain, rather than from the stressing threshold of the components within the receiver circuitry, the signal evaluation circuitry is able to establish a logic high voltage threshold and a logic low voltage threshold that is dependent on that supply voltage. Hence, if the supply voltage of the source voltage domain is changed, the voltage that the receiver circuitry is operated from also changes accordingly, resulting in a change to the logic high voltage threshold and the logic low voltage threshold then established by the signal evaluation circuitry. This enables sufficient margin to be maintained between the logic high voltage threshold and the logic low voltage threshold to enable the signal evaluation circuitry to reliably detect from the first and second internal signals when the input signal transitions between the logic low level and the logic high level in either direction.

Whilst the operation of the first and second internal signal generation circuits ensures that the generated first and second internal signals provided as inputs to the signal evaluation circuitry will not exceed the stressing threshold of the components within the signal evaluation circuitry receiving those inputs, there is still a possibility of certain components suffering from overstress in particular situations, due to the receiver circuitry being operated from the supply voltage of the source voltage domain. In one embodiment, in order to alleviate this possibility, the signal evaluation circuitry further comprises, for at least one component, an associated tracking circuit configured to ensure that a voltage drop across said at least one component is less than or equal to (i.e. does not exceed) said stressing threshold.

The components within the signal evaluation circuitry can take a variety of forms. However, in one embodiment the above-mentioned at least one component comprises a transistor, and the associated tracking circuit comprises at least two additional transistors forming a transistor stack with said transistor, the associated tracking circuit being configured such that as the voltage at the gate of said transistor varies the voltage drop across the transistors within the transistor stack is less than or equal to the stressing threshold. Hence, as the input voltage provided to the gate of the transistor varies, the voltage drop across the various transistors within the transistor stack is altered in order to ensure that no one transistor is exposed to a voltage drop exceeding the stressing threshold.

The first and second internal signal generation circuits can be configured in a variety of ways. However, in one embodiment operation of the first internal signal generation circuitry and the second internal signal generation circuitry is such that there is a dead zone period during which both the first internal signal and the second internal signal do not change their value whilst the input signal is transitioning from a first logic level to a second logic level. This dead zone period results from the way in which the first and second voltage ranges are established.

During the dead zone period, it will be the case that the value of the input signal can be changing without that change being reflected in either the first internal signal or the second internal signal. In certain situations this can give rise to a performance impact in the operation of the receiver circuitry, since during the dead zone period the signal evaluation circuitry is unable to make any determination about the input signal directly from the values of the first and second internal signals. In one embodiment, this performance impact is alleviated through the provision of assist circuitry within the signal evaluation circuitry.

In particular, in one embodiment the first logic level is a logic low level and the second logic level is a logic high level, and the values of the first internal signal and the second internal signal only change to an extent sufficient for the signal evaluation circuitry to detect the logic high voltage threshold being reached after the dead zone period has passed. To address this issue, the signal evaluation circuitry further comprises assist circuitry (also referred to herein as Rx_Pull circuitry) configured to cause the logic high voltage threshold to be reached more quickly than would be the case if the signal evaluation circuitry waited for the values of the first and second internal signals to cause the logic high voltage threshold to be reached.

In one particular embodiment, the assist circuitry is responsive to detection of a voltage at a first internal node of the signal evaluation circuitry falling to a predetermined level prior to the dead zone period starting, to initiate an assist operation to pull a second internal node of the signal evaluation circuitry to a voltage level indicative of the logic high voltage threshold being reached. Accordingly, in such an arrangement, there is no longer a need to wait for the dead zone period to pass, and for the first and second internal signals to then continue to change, in order to detect the logic high voltage threshold being met.

In one embodiment, in situations where the first logic level is a logic high level and the second logic level is a logic low level, the values of the first internal signal and the second internal signal change to an extent sufficient for the signal evaluation circuitry to detect the logic low voltage threshold being reached, causing a corresponding transition in the output signal after the dead zone period has passed.

The first and second voltage ranges can be established in a variety of ways. In one embodiment, the first voltage range extends between the supply voltage and a first intermediate voltage, and the second voltage range extends between a second intermediate voltage and a reference voltage. In one particular embodiment, the reference voltage is a ground voltage.

The first and second intermediate voltages can be derived in a variety of ways. In one embodiment, the second intermediate voltage is derived from said stressing threshold, and the first intermediate voltage is derived from a value determined by subtracting the stressing threshold from the supply voltage. In one particular embodiment, the second intermediate voltage is a value found by subtracting the threshold voltage of an NMOS transistor from the stressing threshold, and the first intermediate voltage is a value found by adding the threshold voltage of a PMOS transistor to that value determined by subtracting the stressing threshold from the supply voltage.

The first and second internal signal generation circuits can be configured in a variety of ways. In one embodiment, the first internal signal generation circuitry comprises components configured such that changes in the first internal signal will track with changes in the input signal once the value of the input signal reaches the first intermediate voltage. Similarly, the second internal signal generation circuitry comprises components configured such that changes in the second internal signal will track with changes in the input signal until the value of the input signal reaches the second intermediate voltage. In this particular arrangement, the earlier-mentioned dead zone period arises between the time when the input signal reaches the second intermediate voltage, and the time when the input signal reaches the first intermediate voltage.

In one particular embodiment, the first internal signal generation circuitry comprises a first transistor and associated tracking circuitry forming a first transistor stack between a terminal providing said input signal and a first signal line providing said first internal signal. Similarly, the second internal signal generation circuitry comprises a second transistor and associated tracking circuitry forming a second transistor stack between the terminal providing said input signal and a second signal line providing said second internal signal. Such an arrangement ensures that none of the components in the first and second internal signal generation circuits are exposed to a voltage drop exceeding their stressing threshold, whilst ensuring that the first and second internal signals track with the input signal in the manner discussed earlier.

Whilst the supply voltage of the source voltage domain may be fixed, in an alternative embodiment the source voltage domain may have multiple operating modes, each with an associated supply voltage, and where at least one of the supply voltages exceeds the stressing threshold of components within the receiver circuitry. For a current operating mode, the receiver circuitry is then configured to operate from the associated supply voltage of the source voltage domain in that current operating mode, such that the logic high voltage threshold and the logic low voltage threshold established by the signal evaluation circuitry vary in dependence on the associated supply voltage. This ensures that a sufficient margin between VIH and VIL is always maintained.

In some implementations, it may be the case that noise and the like serve to reduce the margin between the VIH and VIL levels. In such embodiments, the signal evaluation circuitry may further comprise hysteresis generation circuitry configured to provide an increased margin between the logic high voltage threshold and the logic low voltage threshold established by the signal evaluation circuitry, thereby making the system more robust against such noise.

In one embodiment, the hysteresis generation circuitry is configured to slow down a signal transition on internal signal lines within the signal evaluation circuitry used to detect the logic high voltage threshold and the logic low voltage threshold being reached. This has the result of effectively increasing the margin between the logic high voltage threshold at the logic low voltage threshold.

Whilst the hysteresis generation circuitry may be arranged always be activated, in alternative embodiment the hysteresis generation circuitry is configured to receive an enable signal which when set turns on the hysteresis generation circuitry, and when not set turns off the hysteresis generation circuitry. Hence, operation of the hysteresis generation circuitry may be turned on and off as required, for example depending on whether the receiver circuitry is operating in a noise prone environment or not.

The output generation circuitry may be constructed in a variety of ways. However, in one embodiment the output generation circuitry is configured to receive an intermediate signal from the signal evaluation circuitry indicative of the detected logic level of the input signal, and comprises at least one transistor stack operable, when the input signal has transitioned to a logic high level, to perform an initial voltage drop operation on said intermediate signal. When instead the input signal has transitioned to a logic low level, there is no need for the initial voltage drop operation to be performed, and the signal passes unaltered through the at least one transistor stack.

In addition, in one embodiment the output generation circuitry further comprises buffer circuitry configured to generate the output signal from the output of the at least one transistor stack within the output generation circuitry. Hence, the buffer circuitry performs any necessary remaining down-conversion of the voltage level necessary for the output signal to be constrained within the voltage range of the destination voltage domain.

Viewed from a second aspect the present invention provides a method of operating receiver circuitry to convert an input signal from a source voltage domain into an output signal for a destination voltage domain, the source voltage domain operating from a supply voltage that exceeds a stressing threshold of components within the receiver circuitry, the receiver circuitry being configured to operate from the supply voltage of the source voltage domain and the method comprising: converting the input signal into a first internal signal in a first voltage range; converting the input signal into a second internal signal in a second voltage range; establishing a logic high voltage threshold and a logic low voltage threshold dependent on the supply voltage; performing a detection operation using the first and second internal signals in order to detect based on the logic high voltage threshold and logic low voltage threshold when the input signal transitions between a logic low level and a logic high level; and generating the output signal in dependence on the detection operation; wherein the first voltage range and the second voltage range are such that the first internal signal and second internal signal will not exceed the stressing threshold of the components of the receiver circuitry.

Viewed from a third aspect the present invention provides receiver circuitry for receiving an input signal from a source voltage domain and converting the input signal into an output signal for a destination voltage domain, the source voltage domain operating from a supply voltage that exceeds a stressing threshold of components within the receiver circuitry, the receiver circuitry being configured to operate from the supply voltage of the source voltage domain and comprising: first internal signal generation means for converting the input signal into a first internal signal in a first voltage range; second internal signal generation means for converting the input signal into a second internal signal in a second voltage range; signal evaluation means for establishing a logic high voltage threshold and a logic low voltage threshold dependent on the supply voltage, and further for employing the first and second internal signals in order to detect based on the logic high voltage threshold and logic low voltage threshold when the input signal transitions between a logic low level and a logic high level; and output generation means for generating the output signal in dependence on the detection performed by the signal evaluation means; wherein the first voltage range and the second voltage range are such that the first internal signal and second internal signal will not exceed the stressing threshold of components in the signal evaluation means.

BRIEF DESCRIPTION OF THE DRAWINGS

The present invention will be described further, by way of example only, with reference to embodiments thereof as illustrated in the accompanying drawings, in which:

FIG. 8 is a table illustrating the VIH and VIL levels achieved when employing the receiver circuitry design of FIG. 4 in accordance with one embodiment.

DESCRIPTION OF EMBODIMENTS

Figure 1:
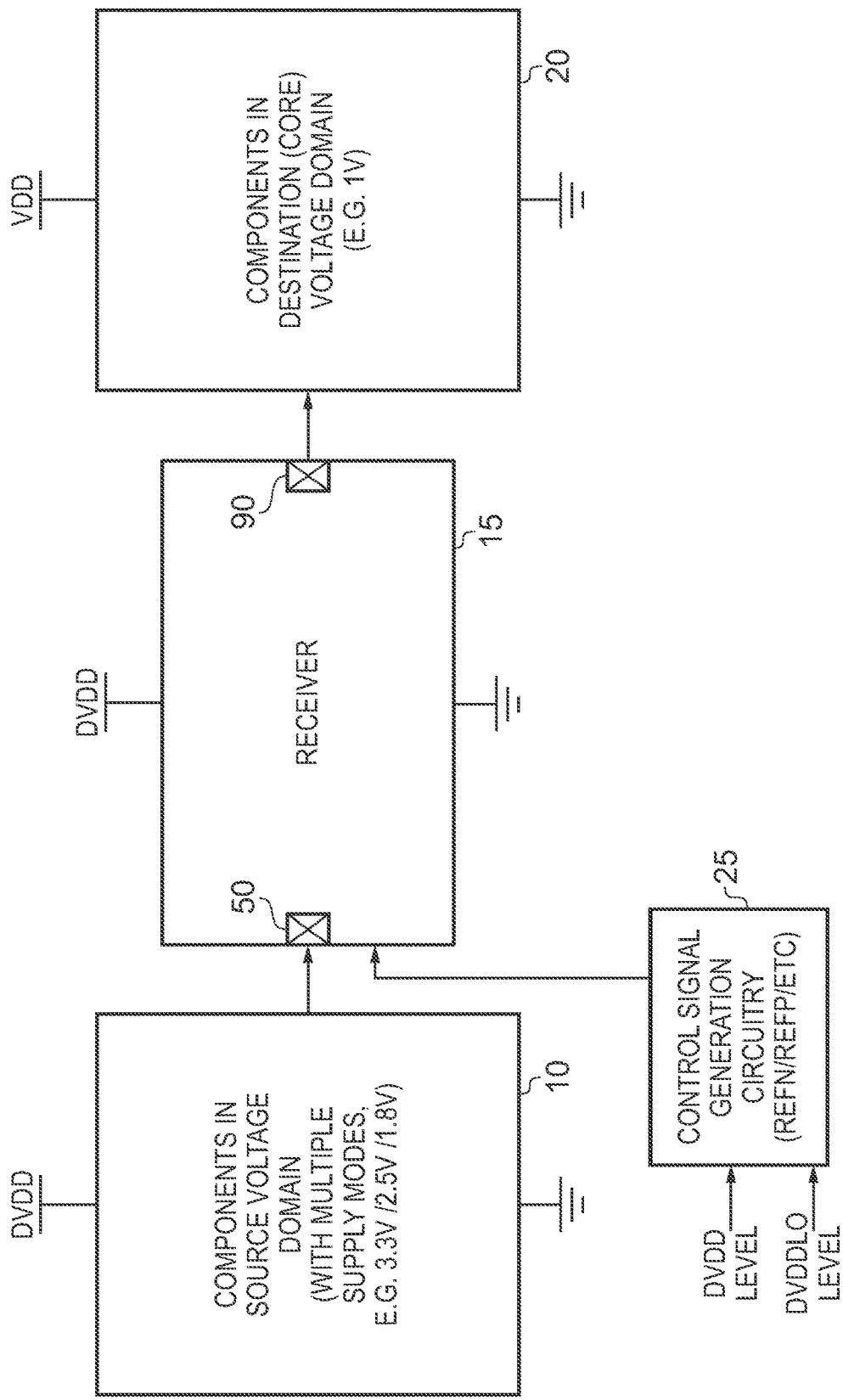
FIG. 1 is a block diagram illustrating a data processing system incorporating a receiver in accordance with one embodiment.

FIG. 1 is a block diagram of a system incorporating a receiver in accordance with one embodiment. As shown, a source voltage domain 10 will include a number of components operating from a supply voltage of the source voltage domain, also referred to herein as DVDD. The reference voltage provided to the source voltage domain is a ground connection, and accordingly signals generated by components in the source voltage domain may vary in a voltage range between DVDD and 0V.

In accordance with the embodiment shown in FIG. 1, a signal generated in the source voltage domain needs to be propagated to one or more components in a destination voltage domain 20, also referred to herein as a core voltage domain. The core voltage domain operates from a supply voltage VDD, and also receives as its reference voltage a ground connection, so that signals in the destination voltage domain vary in the range between VDD and 0V.

The receiver circuitry receives at an input connection 50 (also referred to as an input pad) the signal generated from the source voltage domain, that needs propagating to the destination voltage domain. The receiver then converts that signal from the voltage range of the source voltage domain into a corresponding signal within the voltage range of the destination voltage domain, and outputs that generated output signal from the output connection 90 (also referred to herein as an output pad).

In the embodiment shown in FIG. 1, it is assumed that the receiver is constructed from components having a stressing threshold (for the purposes of the embodiment description it will be assumed that the stressing threshold corresponds to the native voltage of the components) of 1.8V, typically the components being formed from CMOS devices. However, it is assumed that the source voltage domain can operate from a voltage exceeding that native voltage of the components within the receiver 15. It may be that the source voltage domain permanently operates from a voltage larger than that native voltage, or, as shown in the example of FIG. 1, the source voltage domain may have a number of different operating modes, each with an associated supply voltage, where in at least one operating mode the supply voltage exceeds the native voltage of the receiver components.

As shown in FIG. 1, the receiver circuitry 15 is arranged to operate from the same supply voltage as currently being used by the source voltage domain, namely DVDD, and will accordingly operate from this supply voltage even in situations where the supply voltage exceeds the native voltage of the components within the receiver. By using the supply voltage DVDD that is used by the source voltage domain, this enables the receiver circuitry to maintain a suitable margin between the VIH and VIL voltages, to ensure reliable detection of transitions in the input signal between logic low and logic high levels in either direction. However, in order to avoid overstress of components within the receiver, a number of measures are adopted within the receiver circuitry 15 to ensure that the individual components within the receiver are not exposed to voltages above their native voltage. To enable these measures to be achieved, the receiver is arranged to receive a number of control signals from the control signal generation circuitry 25, with those control signals being generated dependent on the current DVDD level being used by the source voltage domain, and a specified DVDDLO value (in the embodiments described herein DVDDLO being 1.8V). In particular, the control signal generation circuitry 25 will generate two reference voltage levels, referred to herein as REFN and REFP. REFN is an NMOS reference voltage which is set equal to the native voltage of the components within the receiver 15, and hence will be set to 1.8V in the earlier mentioned example. REFP is a PMOS reference voltage and is set equal to DVDD-REFN. Accordingly, the value of REFP will vary dependent on the supply voltage DVDD being used by the source voltage domain. As will be discussed in more detail later, the control signal generation circuitry 25 may also generate a number of other signals used by the receiver circuitry 15 to control the generation of the output signal from the output pad 90 in response to the input signal received at the input pad 50.

Figure 2:
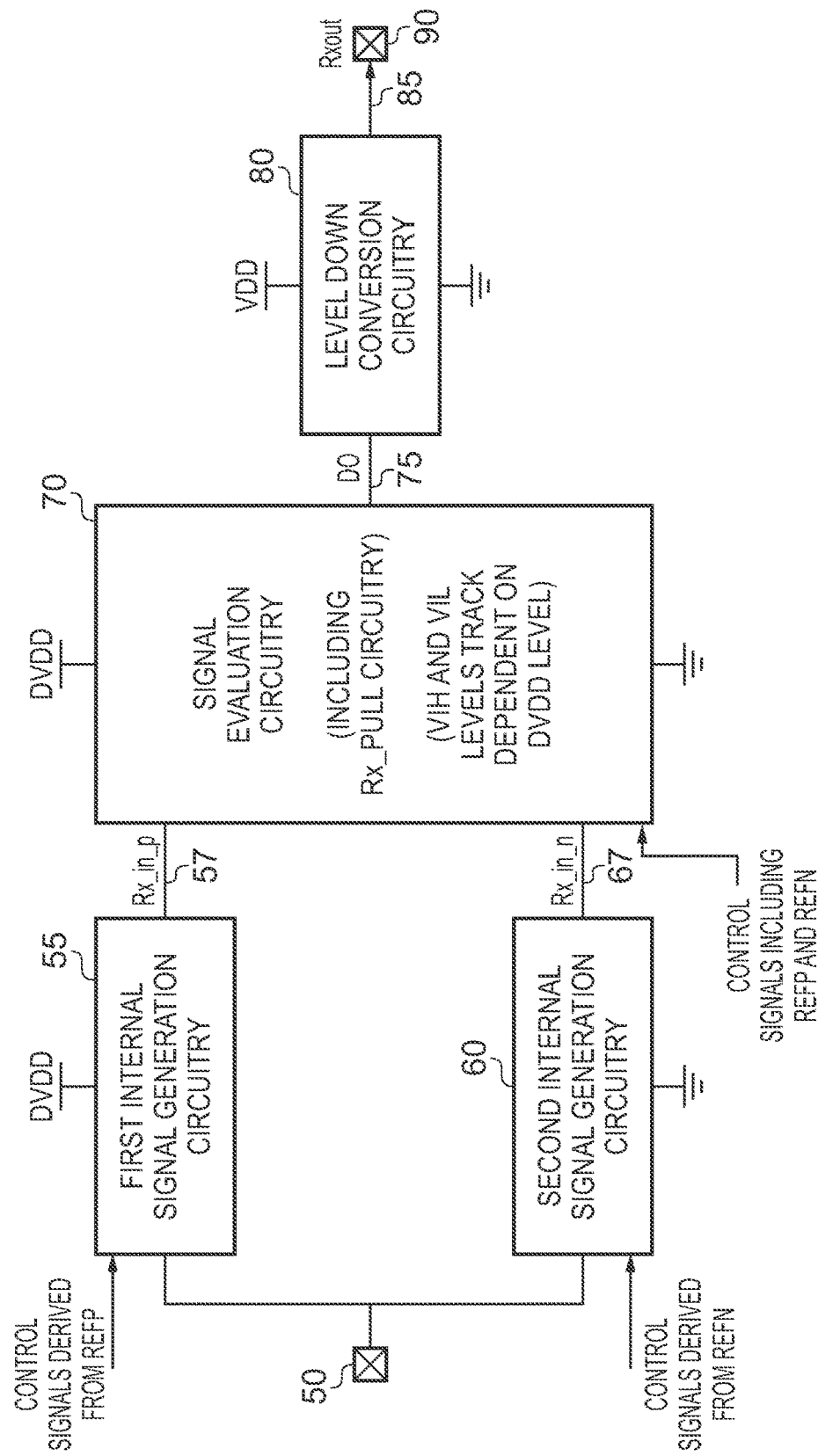
FIG. 2 is a block diagram illustrating components provided within the receiver of FIG. 1 in accordance with one embodiment.

FIG. 2 is a block diagram illustrating in more detail components provided within the receiver 15 of FIG. 1 in accordance with one embodiment. As shown, two different internal signal generation circuits are provided, namely the first internal signal generation circuitry 55 and the second internal signal generation circuitry 60. The first internal signal generation circuitry 55 receives as its supply voltage the DVDD voltage, but has its reference voltage set to the value REFP by virtue of various control signals being received by the first internal signal generation circuitry that are derived from REFP. The first internal signal generation circuitry 55 then receives the input signal from the input pad 50 and converts it to a first internal signal Rx_in_p that is output over path 57. The first internal signal Rx_in_p will vary between the voltage level DVDD and a lower voltage level equal to REFP+VTP (where VTP is the threshold voltage of a PMOS transistor), dependent on the value of the input signal received at the input pad 50.

The second internal signal generation circuitry 60 operates from an effective supply voltage of REFN, and is also connected to ground. It generates a second internal signal Rx_in_n output over path 67, and that signal varies between a voltage level of REFN-VTN (where VTN is the threshold voltage of an NMOS transistor), and the 0V. It receives control signals derived from the REFN voltage level in order to generate the second internal signal within the above-mentioned voltage range.

As a result of the operation of the first and second internal signal generation circuits, the two internal signals generated over paths 57, 67 vary in a voltage range that does not exceed the native voltage range of components within the signal evaluation circuitry 70. Hence, these signals can be used directly as an input to one or more transistors within the signal evaluation circuitry 70 without the risk of potentially damaging those components due to exceeding the gate-source or gate-drain maximum voltage drops that those components are designed to accommodate.

As shown, the signal evaluation circuitry 70 operates between the DVDD supply voltage and ground, and generates an intermediate signal DO output over path 75, which can vary between the DVDD voltage level and 0V. Since the signal evaluation circuitry operates from the same supply voltage as used by the source voltage domain, it establishes VIH and VIL levels that track dependent on the supply voltage of the source voltage domain, hence enabling a sufficient margin to be retained for reliable detection of logic low to logic high transitions and logic high to logic low transitions in the input signal, irrespective of the supply voltage used by the source voltage domain.

As will be discussed later, in order to avoid overstress of any of the components within the signal evaluation circuitry due to a voltage drop across those components exceeding the native voltage (for example a voltage drop between the drain and source of transistors used within the signal evaluation circuitry), a number of tracking circuits are included within the signal evaluation circuitry that monitor the input voltage to those components and ensure that, irrespective of the input voltage, the voltage drop across the components does not exceed the native voltage.

In addition, as will be discussed in more detail later, the operation of the first and second internal signal generation circuits results in there being a period of time, referred to herein as a dead zone period, where neither of the internal signals Rx_in_p and Rx_in_n are changing whilst the input signal's voltage is changing. This can potentially cause an unwanted delay in the detection of a logic low to logic high transition in the input signal, and as will be discussed later with reference to FIG. 4 this delay is alleviated through the use of an assist circuit, also referred to herein as an Rx_Pull circuit.

As shown in FIG. 2, the intermediate signal generated over path 75 is down converted to the voltage range of the destination voltage domain using the level down conversion circuitry 80, which receives the supply voltage VDD of the destination voltage domain. This ensures that the output signal passed over path 85 to the output pad 90 varies in the voltage range between VDD and ground, as required by the components in the destination voltage domain.

Before discussing in detail the construction of the receiver circuitry, the earlier-mentioned tracking circuits will first be discussed with reference to FIGS. 3A and 3B. In particular, the tracking circuits employed are gate tracking circuits used in association with NMOS and PMOS transistors, the function of these gate tracking circuits being to ensure that, irrespective of the voltage logic level (0 or 1) applied to the gate of those NMOS or PMOS transistors, the voltage drop between the drain and source of those transistors does not exceed the native voltage, in this example it being assumed that the native voltage is 1.8V. Considering first FIG. 3A, an NMOS transistor 100 is provided for which the gate tracking functionality is required. This NMOS transistor 100 receives an input signal that can vary between 0 and 1.8V. However, it is coupled to a connection 130 whose voltage can vary between DVDD and 0V. Accordingly, a gate tracking circuit (denoted schematically by element 135 in the right hand side of FIG. 3A) is used to ensure that, irrespective of the voltage level at the connection 130, the voltage drop between the drain and source of the transistor 100 will not exceed the native voltage of that transistor, in this example 1.8V.

Figure 3A:
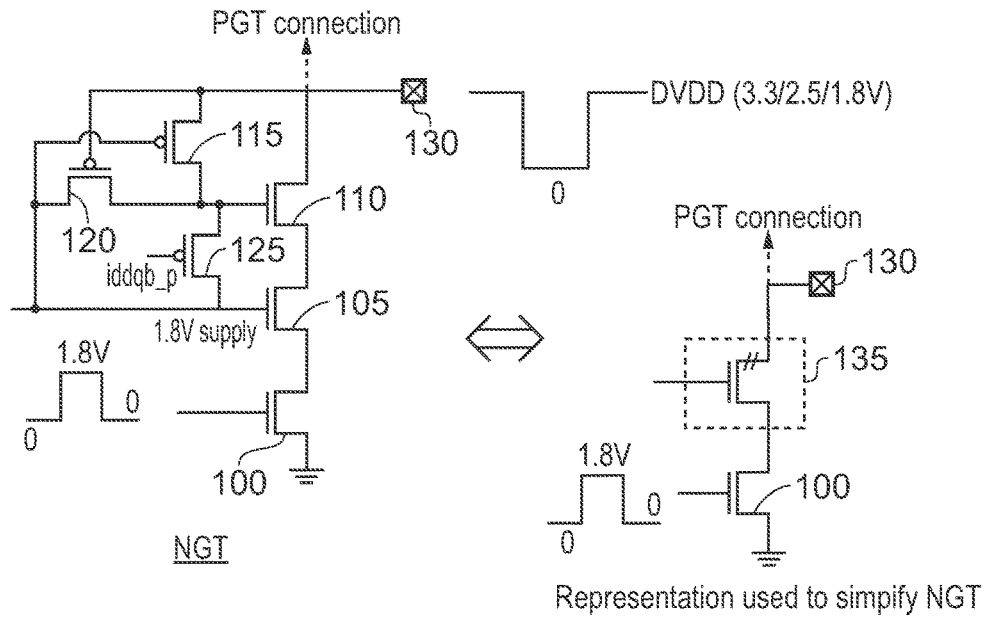
FIGS. 3A and 3B illustrate gate tracking circuits used in association with NMOS devices and PMOS devices, respectively, in accordance with one embodiment.

As shown in more detail in the left hand side of FIG. 3A, the gate tracking circuit 135 (also referred to herein as the NGT circuit) actually consists of a pair of NMOS transistors 105, 110 placed in series with the NMOS transistor 100 to form a transistor stack between the connection point 130 and the ground connection. In addition, a number of further transistors 115, 120, 125 are used to control the operation of the transistor 110 dependent on the voltage level at the connection 130.

When the input signal at the gate of the transistor 100 transitions to the logic high level (1.8V in this case), this turns on the transistor 100, and causes the connection point 130 to discharge to a logic zero level through the other transistors 105, 110. When the input signal to the gate of the transistor 100 returns to a logic zero level, other components within the system will cause the voltage at the connection point 130 to rise back to the DVDD voltage level. In one particular embodiment, it is often the case that the NGT circuit of FIG. 3A is coupled to the PGT circuit of FIG. 3B, and it is the operation of the PGT circuit that causes the connection 130 to transition back to the DVDD level in these circumstances.

When the DVDD voltage level is 1.8V, the control signal iddqb_p is set equal to zero, turning on the transistor 125, and causing the gates of both of the transistors 105, 110 to be turned on. This effectively bypasses the protection functionality of the NGT circuit, since when the DVDD level is 1.8V, there is no risk of overstressing the NMOS component 100. However, when the DVDD level is higher, for example 2.5V or 3.3V, the control signal iddqb_p is set to the DVDD level, turning off the transistor 125. In this instance, the voltage provided to the gate of the transistor 110 is then dependent on the operation of the transistors 115, 120. In particular, it will be appreciated that if the connection point 130 is at 3.3 or 2.5V this will cause the transistor 115 to turn on and the transistor 120 to turn off. Conversely, if the connection point 130 is at a zero volt level, this will cause the transistor 120 to turn on and the transistor 115 to turn off. This will hence control the voltage drop across the individual transistors 100, 105, 110 in the transistor stack to ensure that no one transistor is exposed to a voltage drop that exceeds the native voltage of those transistors, irrespective of whether the connection point 130 is at the DVDD voltage level or the 0V level.

Figure 3B:
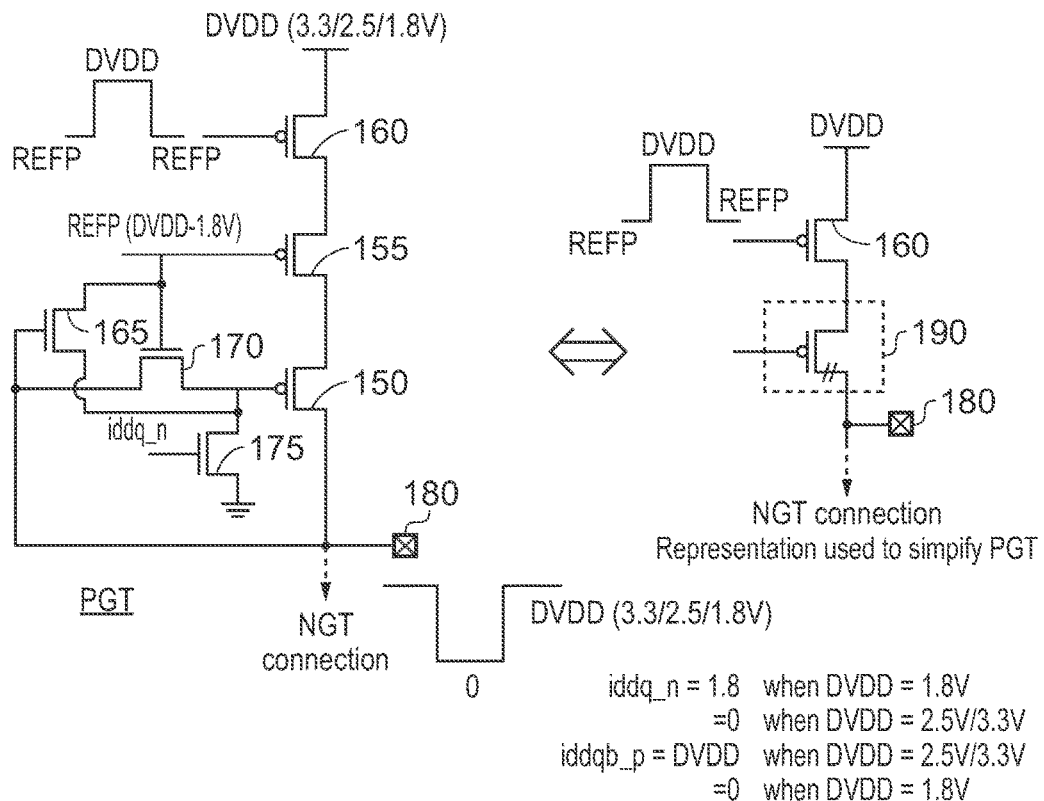

FIG. 3B shows the equivalent gate tracking circuitry 190 for the PMOS transistor 160. In this instance, the input signal to the PMOS transistor 160 varies between the REFP level and the DVDD level. The PGT gate tracking device 190 consists of an additional two PMOS transistors 150, 155 placed in series with the PMOS transistor 160 to form a transistor stack between the DVDD level and the connection point 180. In addition, transistors 165, 170 and 175 provide control functionality for the input to the gates of the transistor 150. When the DVDD voltage is set to 1.8V, the iddq_n signal is set to 1.8V, turning on the transistor 175 and providing a logic zero input to the gate of the PMOS transistor 150, turning that transistor on. In that instance, REFP will also be at a logic zero level, turning on the PMOS transistor 155, and accordingly the protection functionality of the PGT device will be bypassed in that situation, as it is not required. Otherwise, the transistor 175 will be turned off, and the gate voltages provided to the PMOS transistor 150 will depend on the operation of the PMOS transistors 165, 170. The NMOS transistors 165, 170 operate in essentially the same way as described earlier for the control transistors 115, 120 of the NGT device, with one of the NMOS transistors 165, 170 being turned on whilst the other is turned off, thus ensuring that at any point in time the voltage drop across any of the PMOS transistors 150, 155, 160 in the transistor stack does not exceed the native voltage of those transistors.

The gate tracking circuits described in FIGS. 3A and 3B are similar to those described in the article "5.5-V I/O in a 2.5-V 0.25-um CMOS Technology" by A J Annema et al, IEEE Journal of Solid State Circuits, 2001, which describes in general terms using gate tracking technology in association with transistors to improve lifetime of those components.

Figure 4:
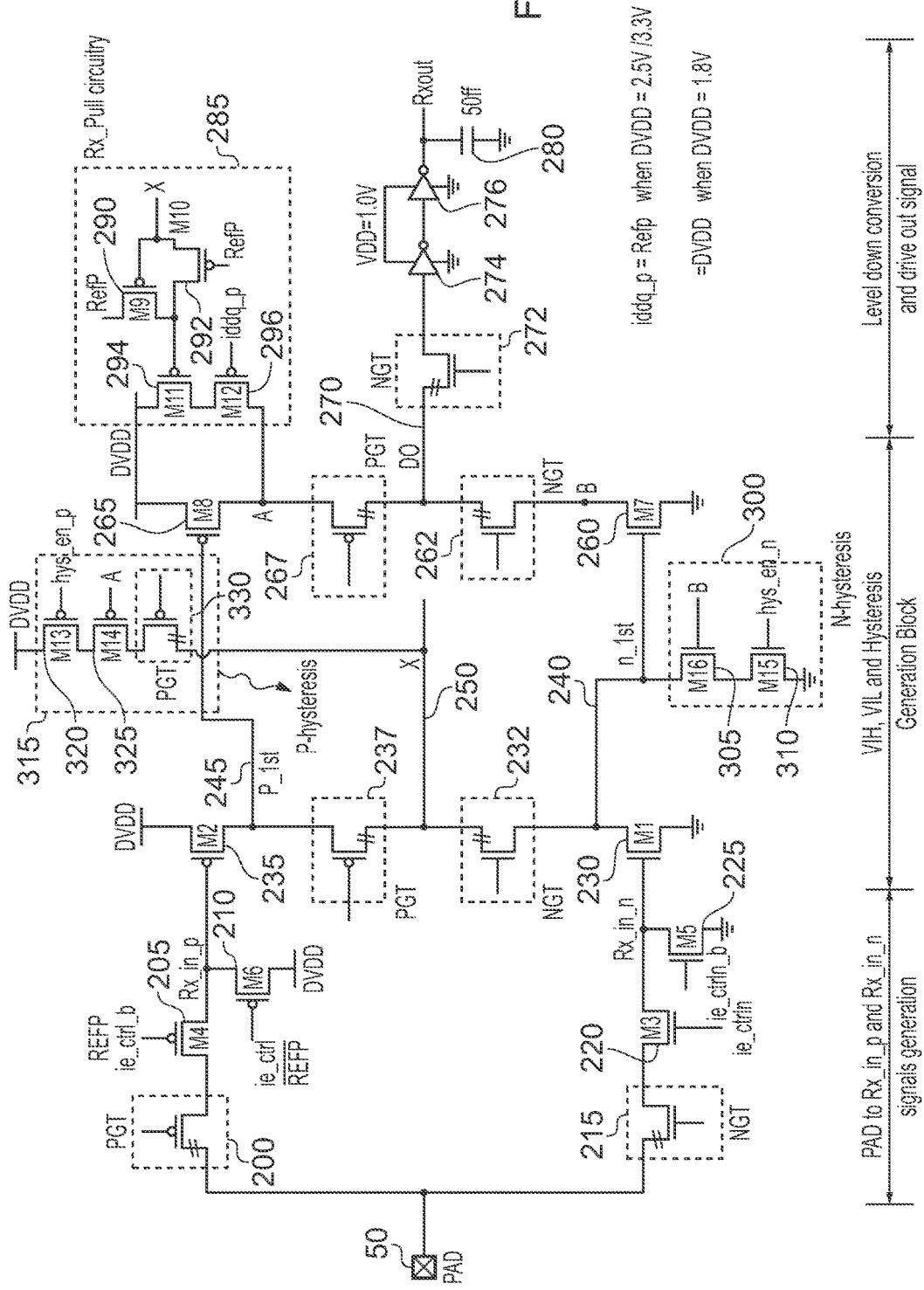
FIG. 4 illustrates the receiver circuitry in accordance with one embodiment.

FIG. 4 is a diagram illustrating in more detail the receiver of FIGS. 1 and 2 in accordance with one embodiment. The first internal signal generation circuitry 55 of FIG. 2 is formed by the PGT device 200, PMOS transistor 205 and the PMOS transistor 210. The input to the gate of the PMOS transistor 205 is a control signal ie_ctrl_b which is set equal to REFP. The PMOS transistor 210 then receives the control signal ie_ctrl, which is the inverse of the control signal provided to the transistor 205. These components operate such that the first internal signal Rx_in_p generated by those components will track with changes in the input signal at the input pad 50 once the value of the input signal reaches a first intermediate voltage. As mentioned earlier, this first intermediate voltage will be set equal to REFP+VTP, where VTP is the threshold voltage of the PMOS transistors. Hence, considering the example where DVDD is 3.3V, and the threshold voltage of the PMOS transistors is 0.5V, it will be seen that REFP is 1.5V, and accordingly the first intermediate voltage will be 2.0V. Hence, whenever the input voltage exceeds 2V, Rx_in_p will track with the input voltage.

The second internal signal generation circuitry 60 is formed of the NGT device 215, the NMOS transistor 220 and the NMOS transistor 225. In this instance, the control signal ie_ctrln provided at the gate of the NMOS transistor 220 is set equal to REFN, and the control ie_ctrln_b provided to the gate of the transistor 225 is the inverse of the ie_ctrln signal. These components operate to ensure that the second internal signal Rx_in_n will track with changes in the input signal between 0V and the point where the input signal reaches a second intermediate voltage. The second intermediate voltage will be REFN-VTN, and accordingly in the above example where the native voltage is 1.8V, and the threshold voltage is 0.5V, this will mean that the second intermediate voltage will be 1.3V.

The signal evaluation circuitry essentially consists of the transistors 230, 235, 260, 265 and associated NGT and PGT tracking circuits 232, 237, 262, 267. Hence, when the input signal on the pad 50 transitions from the logic low to the logic high level, the transistor 230 will turn on and the transistor 235 will turn off. This in turn will cause the transistor 265 to turn on and the transistor 260 to turn off, hence pulling the intermediate signal DO on the line 270 to the logic high (DVDD) level. As will be discussed in more detail later, due to a dead zone period where the internal signals Rx_in_n and Rx_in_p are not changing whilst the input signal is changing, the above described operation is actually supplemented by the Rx_Pull circuitry 285, which ensures that the intermediate signal DO is pulled up to the DVDD level quicker than would be the case merely from relying on the transitions in the signals on the lines 240, 245.

Conversely, when the input signal is transitioning from a logic high state to a logic low state, the transistor 230 will turn off and the transistor 235 will turn on. This will in turn cause the transistor 265 to turn off and the transistor 260 to turn on, pulling the intermediate signal DO on the line 270 down to the logic zero level.

Hence, it can be seen that in both situations the signal DO on the line 270 tracks with the input signal, and provides a signal which can then be down converted by the level down conversion circuitry 80 (formed of the NGT device 272 and the buffer circuitry 274, 276) in order to form the output signal within a voltage range required by the destination voltage domain.

Since the transistors 230, 235 are coupled between the DVDD voltage level and ground, this enables the signal evaluation circuitry to establish VIH and VIL levels but vary dependent on the value of DVDD. The value of the signal on the line 240 is effectively used to evaluate the VIL condition, whilst the value of the signal on the line 245 is effectively used to evaluate the VIH condition.

The operation of the Rx_Pull circuitry 285 will now be described in more detail. As mentioned earlier, this operates to speed up detection of the logic low to logic high transition of the input signal 50. During such a transition, the transistor 230 will turn on, and will begin to discharge the line 240. This will also begin to discharge the node X on the signal line 250 provided between the NGT 232 and PGT 237 devices. The PMOS transistor 235 will also begin to be turned off, and accordingly over time the signal on the line 245 will transition towards the logic zero level. However, rather than waiting for the voltage on the signal line 245 to discharge to a sufficient level to turn on the PMOS transistor 265, the Rx_Pull circuitry 285 instead monitors the voltage on the node 250. As soon as this drops to a level sufficient to turn on the transistor 290, this will cause the action of the transistors 290 and 292 to turn on the transistor 294. In situations where the DVDD level is 2.5V or 3.3V, the transistor 296 will also be turned on, and as a result node A will be pulled up to the DVDD level without needing to wait for the transistor 265 to turn on.

However, for certain supply voltages, it is not necessary to use the Rx_Pull circuitry. For example, when the supply voltage DVDD is 1.8V, then the iddq_p signal is set to DVDD, thereby turning off the PMOS transistor 296, and disabling the action of the Rx_Pull circuitry 285.

When the intermediate signal DO on line 270 transitions to the DVDD logic level, the NGT component 272 is used to drop that voltage down to a lower level, before it is input to the buffer circuitry 274, 276, which then performs the remaining down conversion in order to generate the output signal varying in the voltage range between 1.0V and ground. Conversely, when the intermediate signal DO is at the 0V level, that signal passes unaltered through the NGT component 272, and is merely output "as is" via the buffer circuitry 274, 276. The capacitance 280 shown in the figure represents the output load.

As mentioned earlier, by operating the receiver circuitry from the supply voltage DVDD, this enables a good margin to be maintained between the VIH and VIL levels, for various different DVDD supply voltages. However, in some situations certain effects can serve to reduce the effective margin between the VIH and VIL levels. For example, when noise is introduced into the circuit, this can reduce the effective margin between VIH and VIL, and may in certain situations adversely affect the reliable detection of logic low to logic high and logic high to logic low transitions. In one embodiment, this problem can be alleviated through the provision of hysteresis generation circuits 300, 315. These circuits can be enabled or disabled via setting of the hysteresis enable signals. In particular, the hys_en_n signal can be enabled by setting that signal to the REFN level, thereby turning on the transistor 310, or can be disabled by setting that signal to a logic zero value, turning off the transistor 310. Similarly, the hys_en_p signal can be set to the REFP level in order to turn on the PMOS transistor 320, or can be set to the DVDD level, in order to turn off the transistor 320 when the hysteresis generation circuitry is not required.

As discussed earlier, during a logic high to logic low transition of the input signal, the voltage on the signal line 240 will begin to rise, and at some point will turn on the transistor 260. When the hysteresis circuit 300 is enabled, since the starting voltage of the node B will be at a logic high level, the hysteresis circuitry will weakly pull the signal line towards the logic zero level, and hence will resist the rising of the signal on the line 240. This will hence delay the time at which the transistor 260 is turned on, and accordingly will delay the discharging of the node B. Accordingly, this will effectively reduce the VIL level.

In a similar manner, the hysteresis generation circuitry 315 can effectively elevate the VIH level. However, since the Rx_Pull circuitry 285 is being used to manage the detection of the logic low to logic high transition in the input signal, and the Rx_Pull circuitry operates from the value of the node X on the line 250, the hysteresis generation circuitry 315 is connected between the DVDD supply voltage level and node X. When the hysteresis generation circuitry 315 is enabled, it will serve to weakly pull the node X towards the logic high level, and hence will resist the discharging of node X to a certain extent. This will slow down the operation of the Rx_Pull circuitry, and hence will effectively increase the VIH level.

Accordingly, it can be seen that by use of the hysteresis generation circuits 300, 315, the effective margin between VIH and VIL is increased, hence enabling effects due to noise and the like to be more readily accommodated whilst still ensuring reliable operation of the receiver circuitry.

Figure 5:
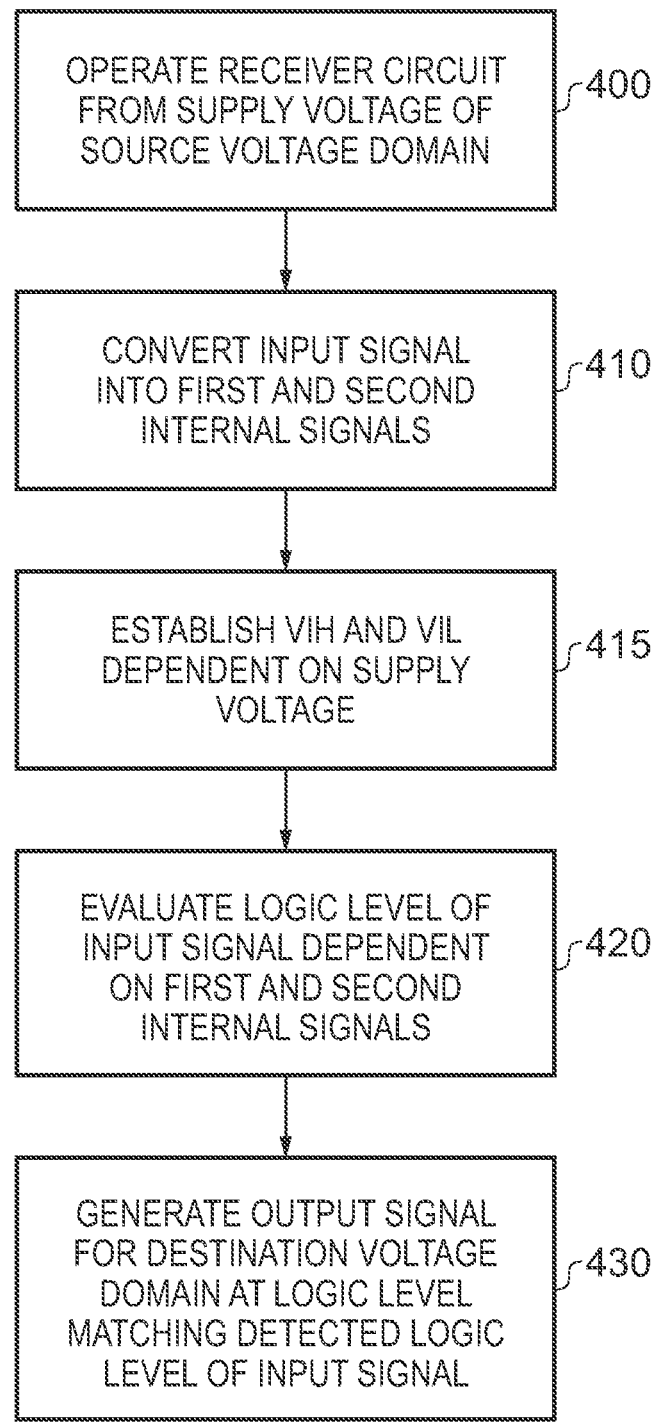
FIG. 5 is a flow diagram illustrating the operation of the receiver circuitry in accordance with one embodiment.

FIG. 5 is a flow diagram schematically illustrating the operation of the receiver circuitry in accordance with one embodiment. At step 400, the receiver circuitry is operated from the supply voltage of the source voltage domain. Hence, if the supply voltage of the source voltage domain changes, then so will the supply voltage from which the receiver is operated, ensuring that VIH and VIL track with the supply voltage of the source voltage domain.

At step 410, the input signal is converted into first and second internal signals by the internal signal generation circuits 55, 60.

At step 415, VIH and VIL levels are established by the operation of the signal evaluation circuitry 70, and as mentioned earlier these VIH and VIL levels will be dependent on the supply voltage. At step 420, the VIH, VIL and first and second internal signals are used to evaluate the logic level of the input signal, based on the operation of the receiver circuitry described earlier. Thereafter, at step 430, an output signal is generated for the destination voltage domain at a logic level matching the detected logic level of the input signal.

Figure 6:
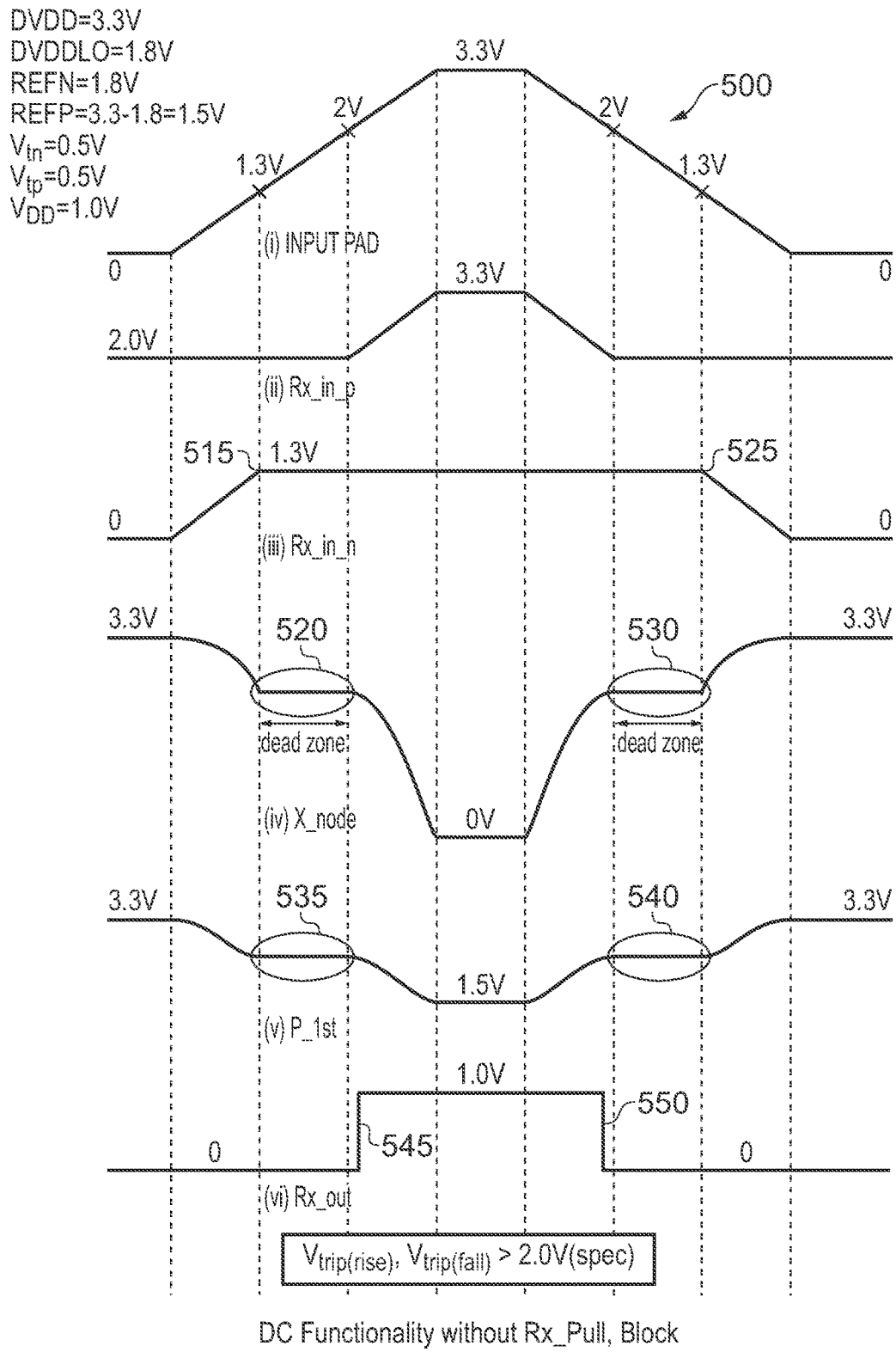
FIG. 6 is a timing diagram illustrating how the output signal varies with the input signal in the absence of the assist circuitry (also referred to herein as Rx_Pull circuitry) shown in FIG. 4.

FIG. 6 is a timing diagram illustrating the value of various signals within the receiver circuitry of FIG. 4, but assuming that the Rx_Pull circuitry 285 is not used, and accordingly the dropping of the voltage on the signal line 245 is used to pull up the voltage level at node A during a logic low to logic high transition of the input signal. In this example, it is assumed that DVDD is 3.3V. As can be seen, the first internal signal Rx_in_p tracks with the input voltage once the input voltage exceeds 2V (i.e. REFP+VTP). Conversely, the second internal signal Rx_in_n tracks with the input signal until the input signal reaches 1.3V (i.e. REFN-VTN). Accordingly, whilst the input signal is rising, this results in the dead zone 520 being observed in the discharging of the voltage on the intermediate node X. The corresponding discharge of the signal on the P-1$^{st}$ line 245 is also shown, and again the dead zone effect 535 is shown. Since in this example the Rx_Pull circuitry is not used, the transistor 265 is instead used to detect the logic high state, and the voltage on the signal line 245 will only drop to a level sufficient for the transistor 265 to turn on after the dead zone period has lapsed, as indicated by the transition 545 in the output signal.

When the signal transitions in the other direction from the logic high to the logic low state, the dead zone effect is also observed as shown by the reference numerals 530, 540 in FIG. 6. However, here it is assumed that the voltage level on the signal line 240 rises sufficiently to turn on the transistor 260, and discharge the node B, prior to the dead zone period arising, and accordingly the transition from the logic high to the logic low state causes the output signal to transition back to the logic zero state at the point 550.

Figure 7:
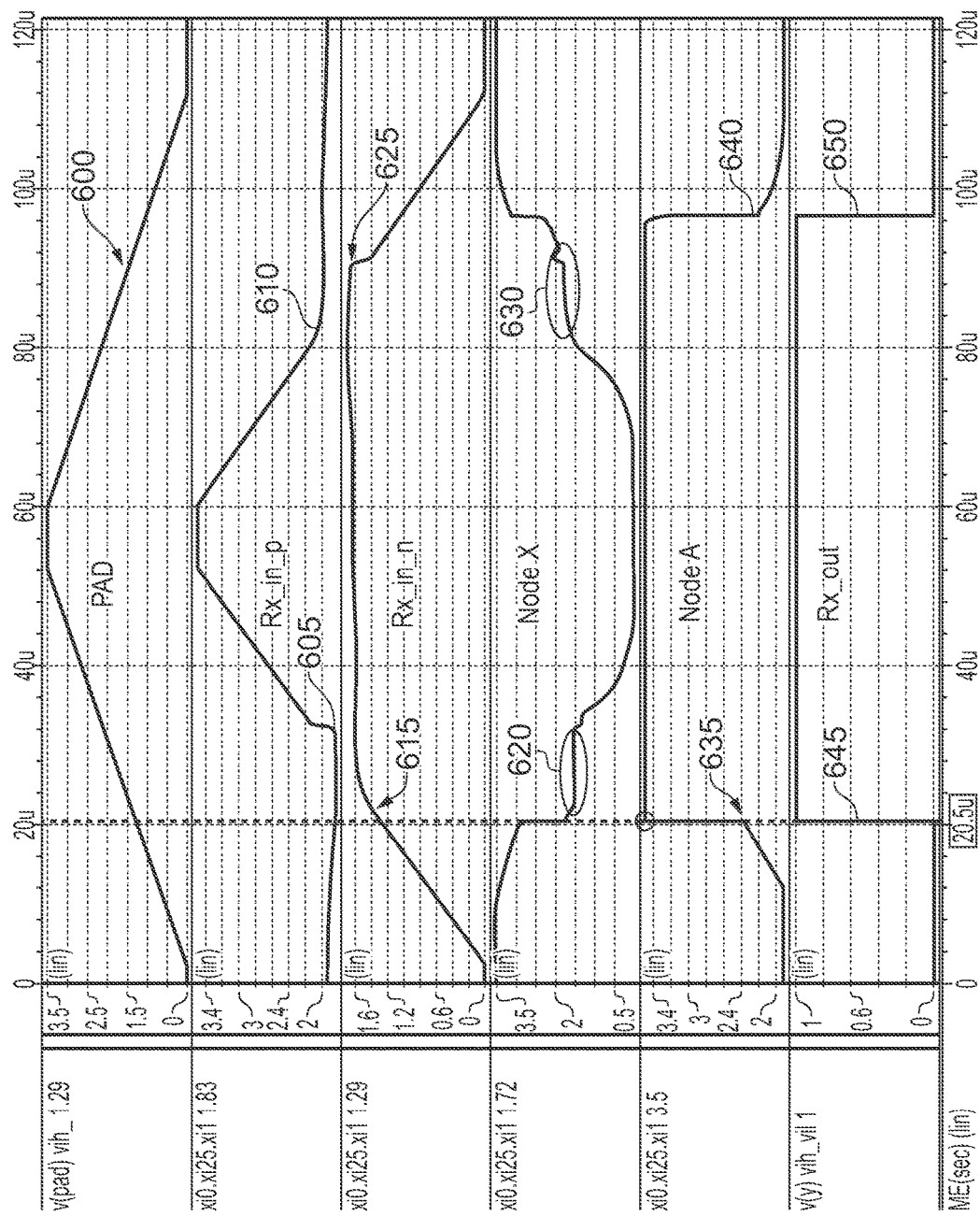
FIG. 7 is a timing diagram illustrating how the output signal varies with the input signal when using the assist circuitry of the embodiment shown in FIG. 4.

FIG. 7 is an equivalent timing diagram produced for the circuitry of FIG. 4, and in particular when using the Rx_Pull circuitry. The points 605, 610, 615, 625 correspond generally with the points 505, 510, 515 and 525 shown in FIG. 6. In the example of FIG. 7, the threshold voltage of the NMOS devices is somewhat less than the 0.5V assumed in FIG. 6 (for example being nearer 0.4V) and this combined with leakage effects results in the Rx-in-n signal transitioning to approximately 1.6V rather than 1.3V.

The dead zones 620, 630 are also shown in respect of node X. However, since the Rx_Pull circuitry will have detected the drop in node X prior to the dead zone, and that drop will have been sufficient to turn on the Rx_Pull circuitry, this causes the voltage at node A to transition high at the point 635, hence causing the output signal to transition high at the point 645.

With regard to the logic high to logic zero transition, node A transitions to the logic low level at point 640 after the dead zone period 630, and this causes a corresponding transition from the logic high to a logic low state at point 650 in the output signal. It should be noted that this transition occurs later in FIG. 7 than in FIG. 6, due to the presence of the Rx_pull circuitry 285 (and in particular the transistor 294) delaying the pull down action of the NMOS transistor 260.

As will be seen from a comparison of FIGS. 6 and 7, through use of the circuitry of FIG. 4, this results in a quicker detection of the logic zero to logic high transition, and hence a longer period during which the output signal is at the logic high state.

FIG. 8 is a table showing the VIH and VIL levels established using the circuitry of FIG. 4 for the three different example supply voltages of 3.3V, 2.5V and 1.8V, and in situations where both the hysteresis generation circuitry is turned on and where it is turned off. In all cases, it can be seen that the VIH levels are set lower than those required by the JEDEC TTL specification, and similarly the VIL levels are set higher than those required by the JEDEC TTL levels, hence allowing those specifications to be met. Similarly, when the hysteresis generation circuitry is used, the hysteresis generation circuitry generates a level of hysteresis greater than that required by the specification.

From the above described embodiments, it will be seen that such embodiments provide a receiver circuitry which can maintain sufficient margin between VIH and VIL levels when coupled to a source voltage domain operating from a variety of different supply voltages, including at least one supply voltage that exceeds the native voltage of the components within the receiver. The receiver circuitry is operated from the same supply voltage as used by the source voltage domain, enabling the VIH and VIL levels to track with changes in the supply voltage of the source voltage domain. Further, components are provided within the receiver circuitry to ensure that the components within the receiver are not subjected to overstress conditions which could reduce the lifetime or reliability of the receiver circuitry. Rx_Pull circuitry is used to speed up the operation of the receiver circuitry, and in addition hysteresis generation circuitry can optionally be utilised to selectively increase the margin between the VIH and VIL levels when required, for example to accommodate noisy environments.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

The invention claimed is:

1. Receiver circuitry for receiving an input signal from a source voltage domain and converting the input signal into an output signal for a destination voltage domain, the source voltage domain operating from a supply voltage that exceeds a stressing threshold of components within the receiver circuitry, the receiver circuitry being configured to operate from the supply voltage of the source voltage domain and comprising:
   first internal signal generation circuitry configured to convert the input signal into a first internal signal in a first voltage range;
   second internal signal generation circuitry configured to convert the input signal into a second internal signal in a second voltage range;
   signal evaluation circuitry configured to establish a logic high voltage threshold and a logic low voltage threshold dependent on the supply voltage, and further configured to employ the first and second internal signals in order to detect based on the logic high voltage threshold and logic low voltage threshold when the input signal transitions between a logic low level and a logic high level;
   assist circuitry coupled to the signal evaluation circuitry and configured to cause a logic high voltage threshold to be reached more quickly than the signal evaluation circuitry relying on transitions of the first and second internal signals to cause the logic high voltage threshold to be reached, wherein the assist circuity is activated to be used instead of the signal evaluation circuitry based on a determination that the supply voltage is above a predetermined threshold; and
   output generation circuitry configured to generate the output signal in dependence on the detection performed by the signal evaluation circuitry;
   wherein the first voltage range and the second voltage range are such that the first internal signal and second internal signal will not exceed the stressing threshold of components in the signal evaluation circuitry.

2. Receiver circuitry as claimed in claim 1, wherein the signal evaluation circuitry further comprises, for at least one component, an associated tracking circuit configured to ensure that a voltage drop across said at least one component is less than or equal to said stressing threshold.

3. Receiver circuitry as claimed in claim 2, wherein said at least one component comprises a transistor, and the associated tracking circuit comprises at least two additional transistors forming a transistor stack with said transistor, the associated tracking circuit being configured such that as the voltage at a gate of said transistor varies the voltage drop across the transistors within the transistor stack is less than or equal to said stressing threshold.

4. Receiver circuitry as claimed in claim 1, wherein operation of the first internal signal generation circuitry and the second internal signal generation circuitry is such that there is a dead zone period during which both the first internal signal and the second internal signal do not change their value whilst the input signal is transitioning from a first logic level to a second logic level.

5. Receiver circuitry as claimed in claim 4, wherein:
   the first logic level is a logic low level and the second logic level is the logic high level;
   values of the first internal signal and the second internal signal only change to an extent sufficient for the signal evaluation circuitry to detect the logic high voltage threshold being reached after the dead zone period has passed.

6. Receiver circuitry as claimed in claim 5, wherein the assist circuitry is responsive to detection of a voltage at a first internal node of the signal evaluation circuitry falling to a predetermined level prior to the dead zone period starting, to initiate an assist operation to pull a second internal node of the signal evaluation circuitry to a voltage level indicative of the logic high voltage threshold being reached.

7. Receiver circuitry as claimed in claim 4, wherein:
   the first logic level is a logic high level and the second logic level is a logic low level; and
   values of the first internal signal and the second internal signal change to an extent sufficient for the signal evaluation circuitry to detect the logic low voltage threshold being reached, causing a corresponding transition in the output signal after the dead zone period has passed.

8. Receiver circuitry as claimed in claim 1, wherein:
   the first voltage range extends between the supply voltage and a first intermediate voltage, and the second voltage range extends between a second intermediate voltage and a reference voltage.

9. Receiver circuitry as claimed in claim 8, wherein the second intermediate voltage is derived from said stressing threshold, and the first intermediate voltage is derived from a value determined by subtracting the stressing threshold from the supply voltage.

10. Receiver circuitry as claimed in claim 8, wherein:
said first internal signal generation circuitry comprises components configured such that changes in the first internal signal will track with changes in the input signal once a value of the input signal reaches the first intermediate voltage; and
said second internal signal generation circuitry comprises components configured such that changes in the second internal signal will track with changes in the input signal until the value of the input signal reaches the second intermediate voltage.

11. Receiver circuitry as claimed in claim 10, wherein:
said first internal signal generation circuitry comprises a first transistor and associated tracking circuitry forming a first transistor stack between a terminal providing said input signal and a first signal line providing said first internal signal; and
said second internal signal generation circuitry comprises a second transistor and associated tracking circuitry forming a second transistor stack between the terminal providing said input signal and a second signal line providing said second internal signal.

12. Receiver circuitry as claimed in claim 1, wherein:
the source voltage domain has multiple operating modes, each with an associated supply voltage, and at least one of the supply voltages exceeds the stressing threshold of components within the receiver circuitry; and
for a current operating mode, the receiver circuitry is configured to operate from the associated supply voltage of the source voltage domain in that current operating mode, such that the logic high voltage threshold and the logic low voltage threshold established by the signal evaluation circuitry vary in dependence on the associated supply voltage.

13. Receiver circuitry as claimed in claim 1, wherein the signal evaluation circuitry further comprises hysteresis generation circuitry configured to provide an increased margin between the logic high voltage threshold and the logic low voltage threshold established by the signal evaluation circuitry.

14. Receiver circuitry as claimed in claim 13, wherein the hysteresis generation circuitry is configured to slow down a signal transition on internal signal lines within the signal evaluation circuitry used to detect the logic high voltage threshold and the logic low voltage threshold being reached.

15. Receiver circuitry as claimed in claim 13, wherein the hysteresis generation circuitry is configured to receive an enable signal which when set turns on the hysteresis generation circuitry, and when not set turns off the hysteresis generation circuitry.

16. Receiver circuitry as claimed in claim 1, wherein the output generation circuitry is configured to receive an intermediate signal from the signal evaluation circuitry indicative of the detected logic level of the input signal, and comprises at least one transistor stack operable, when the input signal has transitioned to a logic high level, to perform an initial voltage drop operation on said intermediate signal.

17. Receiver circuitry as claimed in claim 16, wherein the output generation circuitry further comprises buffer circuitry configured to generate the output signal from the output of the at least one transistor stack within the output generation circuitry.

18. A method of operating receiver circuitry to convert an input signal from a source voltage domain into an output signal for a destination voltage domain, the source voltage domain operating from a supply voltage that exceeds a stressing threshold of components within the receiver circuitry, the receiver circuitry being configured to operate from the supply voltage of the source voltage domain and the method comprising:
converting the input signal into a first internal signal in a first voltage range;
converting the input signal into a second internal signal in a second voltage range;
establishing a logic high voltage threshold and a logic low voltage threshold dependent on the supply voltage;
performing a detection operation using the first and second internal signals, by a signal evaluation circuitry, in order to detect based on the logic high voltage threshold and logic low voltage threshold when the input signal transitions between a logic low level and a logic high level;
performing an assist operation, by an assist circuitry comprising a plurality of transistors, in order to cause a logic high voltage threshold to be reached more quickly than the signal evaluation circuitry relying on transitions of the first and second internal signals to cause the logic high voltage threshold to be reached, wherein the assist circuity is activated to be used instead of the signal evaluation circuitry based on a determination that the supply voltage is above a predetermined threshold; and
generating the output signal in dependence on the detection operation;
wherein the first voltage range and the second voltage range are such that the first internal signal and second internal signal will not exceed the stressing threshold of the components of the receiver circuitry.

19. Receiver circuitry for receiving an input signal from a source voltage domain and converting the input signal into an output signal for a destination voltage domain, the source voltage domain operating from a supply voltage that exceeds a stressing threshold of components within the receiver circuitry, the receiver circuitry being configured to operate from the supply voltage of the source voltage domain and comprising:
first internal signal generation means for converting the input signal into a first internal signal in a first voltage range;
second internal signal generation means for converting the input signal into a second internal signal in a second voltage range;
signal evaluation means for establishing a logic high voltage threshold and a logic low voltage threshold dependent on the supply voltage, and further for employing the first and second internal signals in order to detect based on the logic high voltage threshold and logic low voltage threshold when the input signal transitions between a logic low level and a logic high level;
assist means, comprising a plurality of transistors, coupled to the signal evaluation means and configured to cause a logic high voltage threshold to be reached more quickly than the signal evaluation means relying on transitions of the first and second internal signals to cause the logic high voltage threshold to be reached, wherein the assist means is activated to be used instead of the signal evaluation means based on a determination that the supply voltage is above a predetermined threshold; and output generation means for generating the output signal in dependence on the detection performed by the signal evaluation means;

wherein the first voltage range and the second voltage range are such that the first internal signal and second internal signal will not exceed the stressing threshold of components in the signal evaluation means.

20. Receiver circuitry as claimed in claim 1, wherein the first voltage range and the second voltage range are determined based on the stressing threshold of components in the signal evaluation circuitry.

* * * * *